United States Patent [19]
Kim et al.

[11] Patent Number: 6,113,465
[45] Date of Patent: Sep. 5, 2000

[54] METHOD AND APPARATUS FOR IMPROVING DIE PLANARITY AND GLOBAL UNIFORMITY OF SEMICONDUCTOR WAFERS IN A CHEMICAL MECHANICAL POLISHING CONTEXT

[75] Inventors: Inki Kim, Tempe, Ariz.; Jim Xu, Corvallis, Oreg.

[73] Assignees: SpeedFam-IPEC Corporation, Chandler, Ariz.; Hewlett-Packard Company, Palo Alto, Calif.

[21] Appl. No.: 09/097,914

[22] Filed: Jun. 16, 1998

[51] Int. Cl.$^7$ ........................................ B24B 1/00
[52] U.S. Cl. .............................. 451/41; 451/5; 451/287; 451/288
[58] Field of Search ................... 451/5, 41, 287, 451/288, 290

[56] References Cited

U.S. PATENT DOCUMENTS

| | | |
|---|---|---|
| 4,805,348 | 2/1989 | Arai et al. . |
| 4,889,586 | 12/1989 | Noguchi et al. . |
| 5,099,614 | 3/1992 | Arai et al. . |
| 5,329,732 | 7/1994 | Karlsrud et al. . |
| 5,335,453 | 8/1994 | Baldy et al. . |

(List continued on next page.)

FOREIGN PATENT DOCUMENTS

| | | |
|---|---|---|
| 0 623 423 | 11/1994 | European Pat. Off. . |
| 0 696 495 A1 | 2/1996 | European Pat. Off. . |
| 0 757 378 A1 | 2/1997 | European Pat. Off. . |
| 0 842 738 | 5/1998 | European Pat. Off. . |
| 6-246602 | 9/1994 | Japan . |
| 2314455 | 12/1997 | United Kingdom . |
| WO 97/20660 | 6/1997 | WIPO . |

OTHER PUBLICATIONS

Notification of Transmittal of the Interational Search Report or the Declaration; PCT/US 99/13297; Date of mailing Nov. 2, 1999.

Ali et al.: "Using variation decomposition analysis to determine the effect of process on wafer—and die—level uniformity in oxide CMP"; Proceedings of the First International Symposium on Chemica Mechanical Planarization, Oct. 1996 (1996–10), pp. 164–175, XP002119213, San Antonio, Texas; pp. 164, 166, and 168; figures 3–11; table I.

*Primary Examiner*—Timothy V. Eley
*Assistant Examiner*—Willie Berry, Jr.
*Attorney, Agent, or Firm*—Snell & Wilmer, LLP

[57] ABSTRACT

The present invention provides methods and apparatus for optimizing the removal of thin film layers during planarization of a semiconductor wafer to achieve global uniformity of the entire semiconductor surface while further achieving the planarity within an individual die structure. A wafer polishing system suitably comprises a wafer polishing apparatus, a controller and a wafer polishing recipe. The wafer polishing recipe may be comprised of various operational parameters utilized for controlling the operation of the polishing apparatus. In a preferred embodiment, the wafer polishing apparatus is initiated with a low down force applied by a carrier apparatus and a high polishing speed applied by a polishing surface to facilitate removal of the thin film layer and optimize the planarity within a single die structure, and then followed with a high down force applied by the carrier apparatus and a low polishing speed applied by the polishing surface to facilitate removal of the thin film layer to optimize the global uniformity of the entire wafer surface. Alternatively, the low down force—high polishing speed and high down force—low polishing speed steps may be reversed without departing from the scope of the invention.

11 Claims, 6 Drawing Sheets

U.S. PATENT DOCUMENTS

| | | |
|---|---|---|
| 5,361,545 | 11/1994 | Nakamura . |
| 5,486,129 | 1/1996 | Sandhu et al. . |
| 5,486,265 | 1/1996 | Salugsugan . |
| 5,498,196 | 3/1996 | Karlsrud et al. . |
| 5,498,199 | 3/1996 | Karlsrud et al. . |
| 5,503,882 | 4/1996 | Dawson . |
| 5,506,177 | 4/1996 | Kishimoto et al. . |
| 5,509,850 | 4/1996 | Morioka et al. . |
| 5,510,652 | 4/1996 | Burke et al. . |
| 5,514,245 | 5/1996 | Doan et al. . |
| 5,562,530 | 10/1996 | Runnels et al. . |
| 5,569,063 | 10/1996 | Morioka et al. . |
| 5,605,487 | 2/1997 | Hileman et al. . |
| 5,618,381 | 4/1997 | Doan et al. . |
| 5,643,056 | 7/1997 | Hirose et al. . |
| 5,665,201 | 9/1997 | Sahota . |
| 5,679,060 | 10/1997 | Leonard et al. . |
| 5,692,947 | 12/1997 | Talieh et al. . |
| 5,707,274 | 1/1998 | Kim et al. . |
| 5,722,877 | 3/1998 | Meyer et al. . |
| 5,733,171 | 3/1998 | Allen et al. . |
| 5,733,177 | 3/1998 | Tsuchiya et al. . |

METHOD AND APPARATUS FOR IMPROVING DIE PLANARITY AND GLOBAL UNIFORMITY OF SEMICONDUCTOR WAFERS IN A CHEMICAL MECHANICAL POLISHING CONTEXT

TECHNICAL FIELD

The present invention relates, generally, to methods and apparatus for the polishing or planarization of the surface of a semiconductor wafer and, more particularly, to a technique utilizing a multi-step process for optimizing the removal of thin film layers during planarization of a semiconductor wafer to achieve improved die planarity and global uniformity.

BACKGROUND ART AND TECHNICAL PROBLEMS

The production of integrated circuits begins with the creation of high-quality semiconductor wafers. During the wafer fabrication process, the wafers may undergo multiple masking, etching, and dielectric and conductor deposition processes. Because of the high-precision required in the production of these integrated circuits, an extremely flat surface is generally needed on at least one side of the semiconductor wafer to ensure proper accuracy and performance of the microelectronic structures being created on the wafer surface. As the size of the integrated circuits continues to decrease and the density of microstructures on an integrated circuit increases, the need for precise wafer surfaces becomes more important. Therefore, between each processing step, it is usually necessary to polish or planarize the surface of the wafer to obtain the flattest surface possible.

For a discussion of chemical mechanical polishing (CMP) processes and apparatus, see, for example, Arai, et al., U.S. Pat. No. 4,805,348, issued February, 1989; Arai, et al., U.S. Pat. No. 5,099,614, issued March, 1992; Karlsrud etal., U.S. Pat. No. 5,329,732, issued July, 1994; Karlsrud, U.S. Pat. No. 5,498,196, issued March, 1996; and Karlsrud et al, U.S. Pat. No. 5,498,199, issued March, 1996.

Such polishing is well known in the art and generally includes attaching one side of the wafer to a flat surface of a wafer carrier or chuck and pressing the other side of the wafer against a flat polishing surface. During the polishing or planarization process, the workpiece or wafer is typically pressed against the polishing pad surface while the pad rotates about its vertical axis. In addition, to improve the polishing effectiveness, the wafer may also be rotated about its vertical axis and oscillated back and forth over the surface of the polishing pad.

In general, the polishing surface comprises a horizontal polishing pad that has an exposed abrasive surface of, for example, cerium oxide, aluminum oxide, fumed/precipitated silica or other particulate abrasives. Polishing pads can be formed of various materials, as is known in the art, and which are available commercially. Typically, the polishing pad may be a blown polyurethane, such as the IC and GS series of polishing pads available from Rodel Products Corporation in Scottsdale, Ariz. The hardness and density of the polishing pad depends on the material that is to be polished.

Prior art polishing machines may utilize different polishing elements, including abrasive tape polishers, rotary drum polishers, linear belt polishers, and roller style polishers. For a discussion of such semiconductor wafer polishing tools, see, for example, Morioka, et al., U.S. Pat. No. 5,509,850, issued Apr. 23, 1996 (Abrasive Tape); Morioka, et al., U.S. Pat. No. 5,569,063, issued Oct. 29, 1996; Hirose, et at., U.S. Pat. No. 5,643,056, issued Jul. 1, 1997; Kim, et al., U.S. Pat. No. 5,707,274, issued Jan. 13, 1998 (Rotary Drum); Talieh, et al., U.S. Pat. No. 5,692,947, issued Dec. 2, 1997; Meyer, et al., U.S. Pat. No. 5,722,877, issued Mar. 3, 1998; Homayoun, et al., European Pat. Application No. EP 0 696 495 A1, published Feb. 14, 1996; Shendon, PCT Application No. PCT/US96/19494, International publication date Jun. 12, 1997 (Linear Belt); Baldy, et al, U.S. Pat. No. 5,335,453, issued Aug. 9, 1994; Nakamura, U.S. Pat. No. 5,361,545, issued Nov. 8, 1994 (Roller Style).

Regardless of the method or apparatus utilized for the polishing of semiconductor wafers, the resulting flatness of the semiconductor wafer is an extremely important factor in wafer quality. Various other methods and apparatus exist which attempt to improve the resulting flatness of the semiconductor wafer during planarization. For example, U.S. Pat. No. 5,485,265, issued Jan. 23, 1996 to Salugrugan, and U.S. Pat. No. 5,562,530, issued Oct. 8, 1996 to Runnels et al., generally relate to methods to achieve a more uniform planarization of the semiconductor wafer in which a pulsing pressure is applied by the polishing surface to the wafer surface. Additionally, U.S. Pat. No. 5,510,652, issued on Apr. 23, 1996 to Burke et al., and U.S. Pat. No. 5,618,381, issued on Apr. 8, 1991 to Doan et al., generally relate to methods of depositing alternating layers of dielectric materials that possess varying degrees of hardness and then utilizing the effects produced by the different polish rates of those materials during planarization to improve the quality of the wafer surface.

Yet another alternative method known for improving the efficiency of the polishing process is disclosed in U.S. Pat. No. 5,733,177, issued Mar. 31, 1998 to Tsuchiya et al., which generally discloses a two-step process for polishing wafers. The first step requires a high down-pressure for the wafer support plate and a low rotational speed for the polishing pad as it polishes the wafer surface, followed by a quick increase in rotational speed and a quick reduction in down-pressure in an attempt to achieve a rapid reduction of the surface roughness, an improvement of the polishing efficiency, and a consequential reduction in the polishing step process time. The second step initially utilizes a medium-pressure and a low rotational speed for the polishing pad which then tapers to an even slower rotational speed in an attempt to prevent hazing of the wafer surface.

Generally, flatness is determined by the evaluation of two parameters, which include the planarity within a die structure or chip and the global uniformity of the entire semiconductor wafer. Although the aforementioned methods and apparatus seek to achieve high-precision planarization of the semiconductor wafer, generally, as one skilled in the art will appreciate, the prior art tends to optimize only one aspect of the overall flatness of the semiconductor wafer, e.g., the global uniformity of the semiconductor wafer surface or the planarity within smaller regions, generally at the expense of the other parameter. This optimization of only one aspect of the overall flatness of the semiconductor wafer surface further results in a lower process yield than what is attainable by the present invention. Thus as one skilled in the art will appreciate, a need exists for a technique which effectively optimizes the global uniformity of the entire semiconductor surface while also optimizing the planarity within an individual die structure or chip.

SUMMARY OF THE INVENTION

Accordingly, it is an advantage of the present invention that an improved chemical mechanical polishing (CMP)

procedure is provided. The CMP procedure achieves a balance between global uniformity of the entire semiconductor surface and planarity within an individual die structure.

Another advantage of the present invention is it provides a multi-step CMP recipe that defines process segments having varying polishing speeds and pressures. The above and other advantages of the present invention may be carried out in one form by a method for polishing a surface of a semiconductor wafer by selecting and applying an appropriate speed and down pressure for achieving a desired planarity within a die structure and selecting and applying an appropriate speed and down pressure for achieving a desired global uniformity of the entire semiconductor surface.

BRIEF DESCRIPTION OF THE DRAWINGS

The present invention will hereinafter be described in conjunction with the appended drawing figures, wherein like numerals denote like elements, and.

DETAILED DESCRIPTION OF THE PREFERRED EXEMPLARY EMBODIMENTS

The subject invention relates to the process of removing thin film layers during polishing of a semiconductor wafer. The preferred embodiment set forth herein relates to a multi-step process for optimizing the global uniformity of a semiconductor wafer as well as the planarity within an individual die structure; it will be appreciated, however, that the principles of the present invention may be employed to ascertain any number of other benefits associated with the planarization of a workpiece surface, including, for example, improved product yield.

Figure 1:
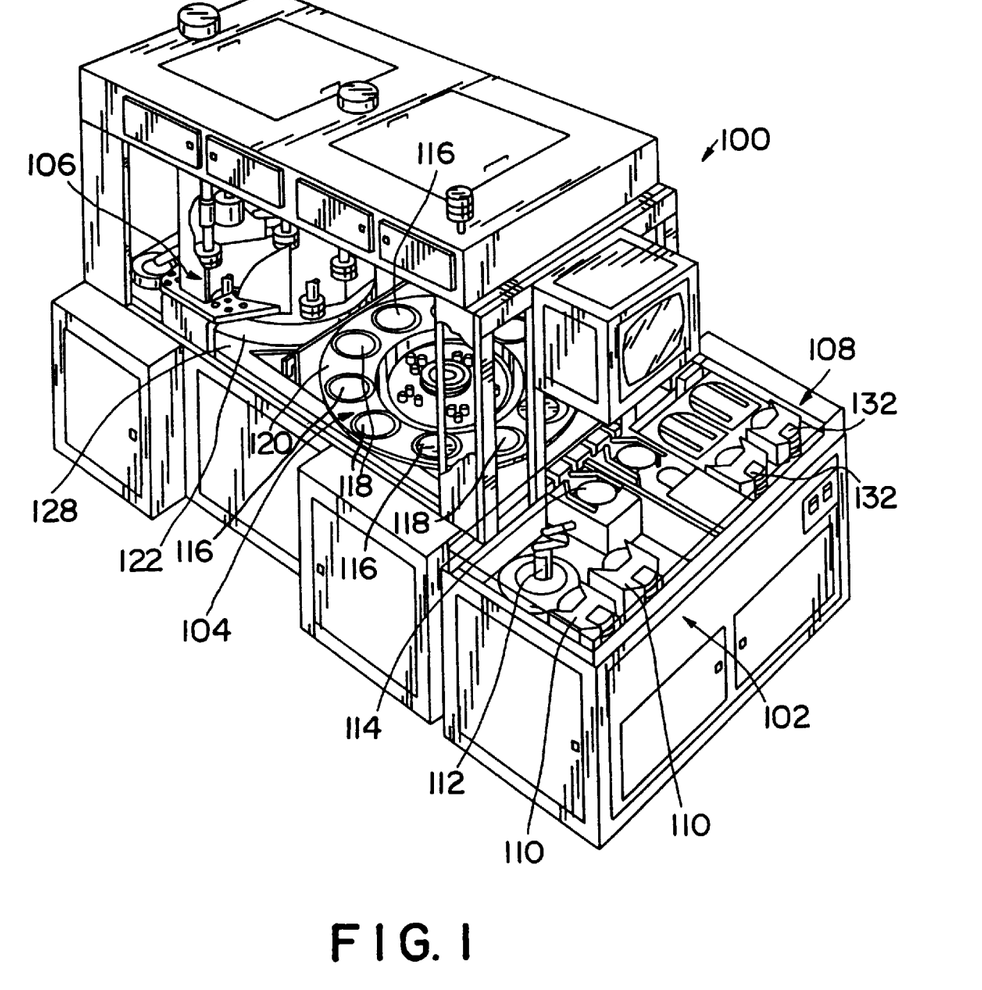
FIG. 1 is a perspective view of an exemplary CMP machine that may incorporate the principles of the present invention.
Figure 2:
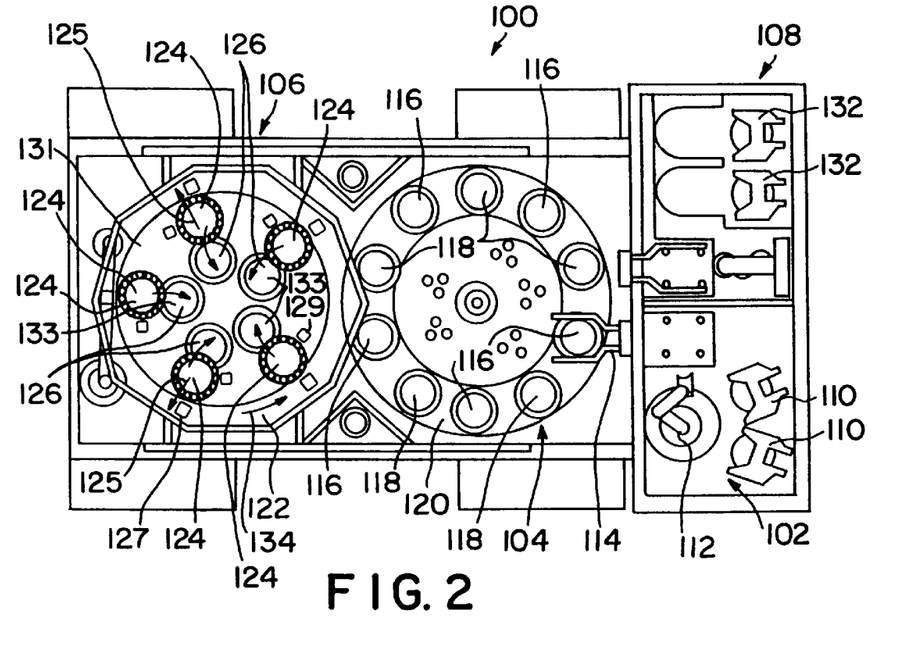
FIG. 2 is a top view of the CMP machine of FIG. 1.

Referring now to FIGS. 1–2, a wafer polishing apparatus 100 may incorporate the principles of the present invention. Wafer polishing apparatus 100 suitably includes a multiple head wafer polishing machine which accepts wafers from a previous processing step, polishes and rinses the wafers, and reloads the wafers back into wafer cassettes for subsequent processing.

Discussing now the polishing apparatus 100 in more detail, apparatus 100 comprises an unload station 102, a wafer transition station 104, a polishing station 106, and a wafer rinse and load station 108.

In accordance with the illustrated embodiment, cassettes 110, each holding a plurality of wafers, are loaded into the machine at unload station 102. Next, a robotic wafer carrier arm 112 removes the wafers from cassettes 110 and places them, one at a time, on a first wafer transfer arm 114. Wafer transfer arm 114 then sequentially lifts and moves each wafer into wafer transition section 104. That is, transfer arm 114 suitably places an individual wafer on one of a plurality of wafer pick-up stations 116 which reside on a rotatable table 120 within wafer transition section 104. Rotatable table 120 also suitably includes a plurality of wafer drop-off stations 118 which alternate with pick-up stations 116. After a wafer is deposited on one of the plurality of pick-up stations 116, table 120 rotates so that a new station 116 aligns with transfer arm 114. Transfer arm 114 then places the next wafer on the new empty pick-up station 116. This process continues until all pick-up stations 116 are filled with wafers. In the illustrated system, table 120 includes five pick-up stations 116 and five drop-off stations 118.

Next, a wafer carrier apparatus 122, comprising individual wafer carrier elements 124, suitably aligns itself over table 120 so that respective carrier elements 124 are positioned directly above the wafers which reside in respective pick-up stations 116. The carrier apparatus 122 then drops down and picks up the wafers from their respective stations and moves the wafers laterally such that the wafers are positioned above polishing station 106. Once above polishing station 106, carrier apparatus 122 suitably lowers the wafers, which are held by individual elements 124, into operative engagement with a polishing surface 126 which sits atop a lap wheel 128. During operation, lap wheel 128 causes polishing surface 126 to rotate about its vertical axis. At the same time, individual carrier elements 124 spin the wafers about their respective vertical axes and oscillate the wafers back and forth across surface 126 (substantially along arrow 133) as they press against the polishing surface. In this manner, the undersurface of the wafer is polished or planarized.

Although CMP machine 100 is shown having five polishing stations, it will be appreciated that the present invention may be employed in the context of virtually any number of polishing stations. Moreover, the present invention may also be employed in circumstances where not all of the polishing stations are functioning at a time. For example, many standard wafer cassettes are capable of carrying up to twenty-five individual workpieces in a single cassette. Consequently, because there are often five workpiece chucks on a single CMP machine, often times the last four disks within a cassette are polished at one time, leaving the fifth disk-holder empty.

Figure 3:
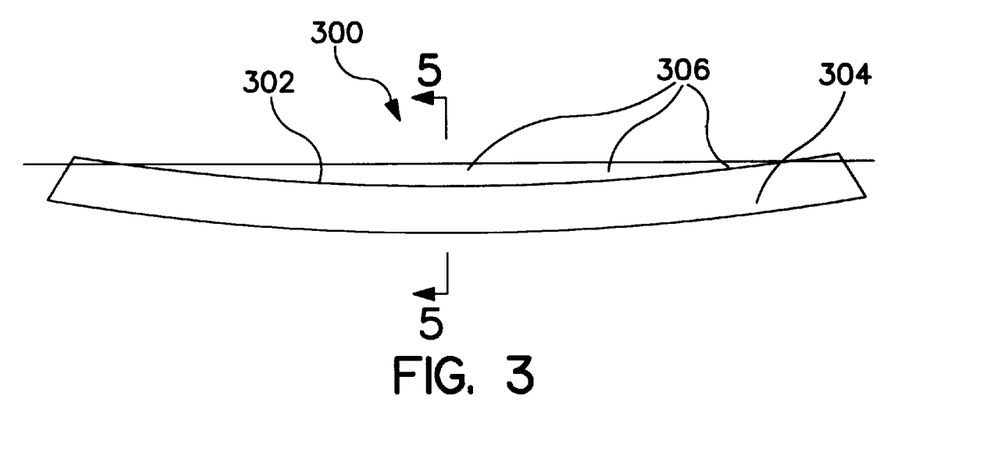
FIG. 3 is a side view of a semiconductor wafer.
Figure 4:
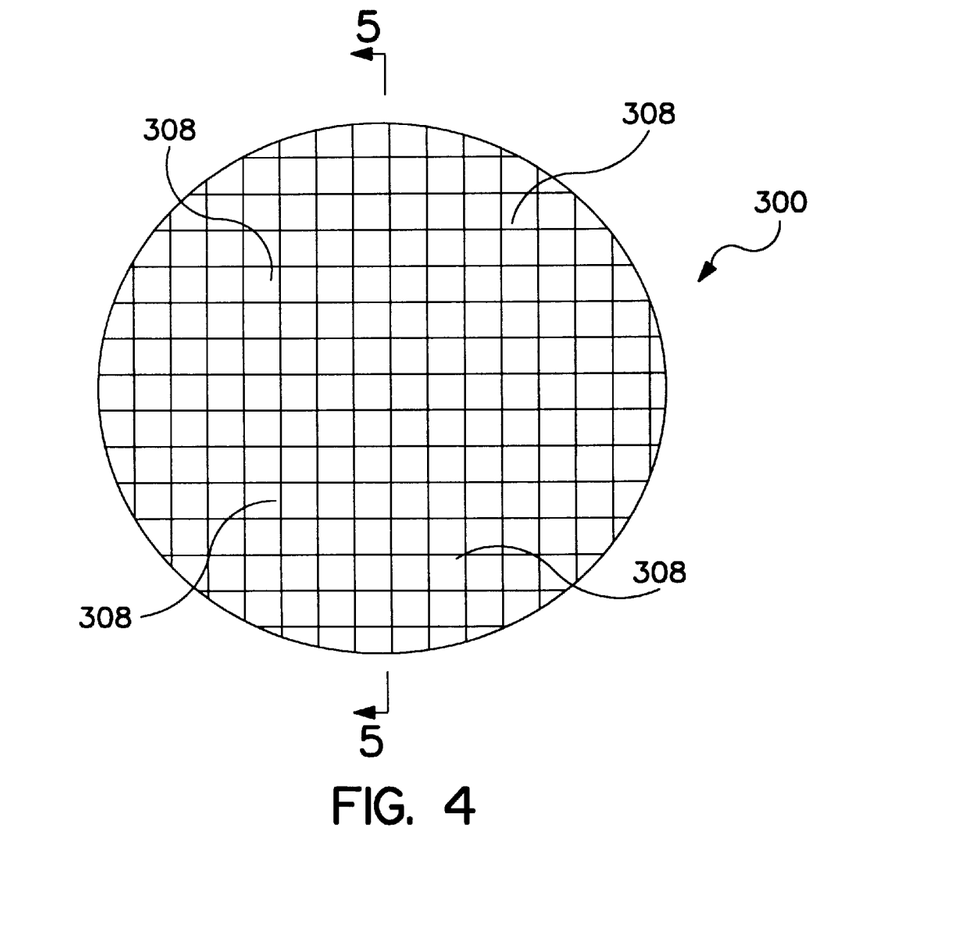
FIG. 4 is a top view of the wafer depicted in FIG. 3 above shown with a plurality of microelectronic die structures disposed thereon.
Figure 5:
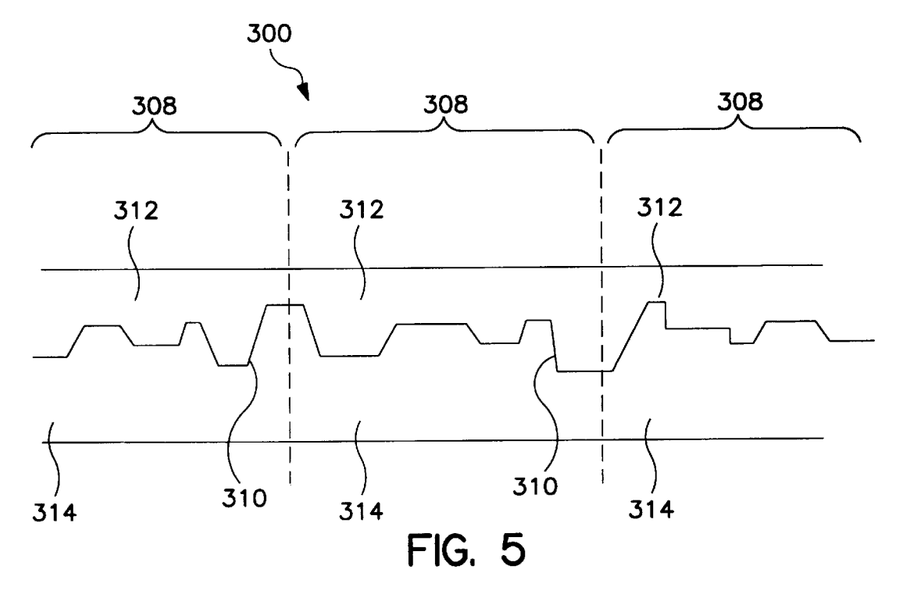
FIG. 5 is a cross sectional depiction of the wafer as viewed from lines 5—5 in FIGS. 3 and 4.

Referring now to FIG. 3, a typical semiconductor wafer 300, before planarization, includes a top surface 302 and a side surface 304. The features of wafer 300 are exaggerated in FIG. 3 for illustrative purposes. As one skilled in the art will appreciate, surface 302 of wafer 300 is typically non-uniform, for example as depicted in non-uniform areas 306. Further, as shown in FIG. 4, an exemplary embodiment of a wafer surface 302 includes a plurality of substantially similar die structures 308 arranged in a rectangular grid pattern. Referring now to FIG. 5 (which is a side sectional view of a portion of wafer 300), each individual die structure 308 may comprise one or more alternating substrate and oxide layers; for example, a substrate layer 314 and an oxide layer 312. Substrate layer 314 generally comprises a plurality of microelectronic structures substantially defining a substrate topology 310. As one skilled in the art will appreciate, the surface layer or topology 312 of substrate 314 within a single die structure 308 is typically uneven, i.e., the planarity within die structure 308 is undesirable. The aforementioned typical problems in uniformity and planarity of semiconductor wafers 300, as set forth in the illustrated examples of FIGS. 3, 4 and 5, are effectively reduced by an exemplary wafer surface polishing method in accordance with the present invention, which will now be discussed in greater detail.

Figure 6:
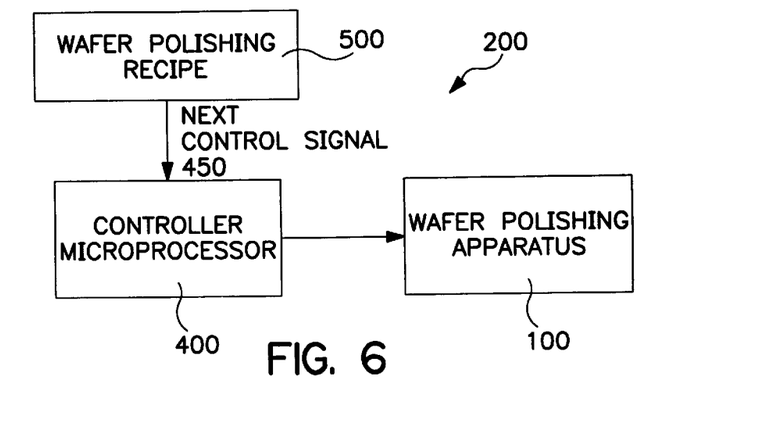
FIG. 6 is a schematic diagram of a preferred hardware and software configuration for the present invention.

With reference to FIG. 6, a wafer polishing system 200 suitably comprises a wafer polishing recipe 500, a controller 400, and wafer polishing apparatus 100 (as previously described). Controller 400 suitably comprises any general purpose controller (e.g., a personal computer) capable of receiving an input stream of programmable data and subsequently controlling the operation of wafer polishing apparatus 100 in accordance with the programmable data. In the preferred embodiment, controller 400 is suitably configured to interpret wafer polishing recipe 500 and to control the operation of wafer polishing apparatus 100 to improve the planarity within die structure 308 while also improving the global uniformity of surface 302 of semiconductor wafer 300. Moreover, wafer polishing recipe 500 may be realized by suitably stored data, program instructions, or the like. Such data may be accessed by controller 400 during the CMP procedure.

Figure 7:
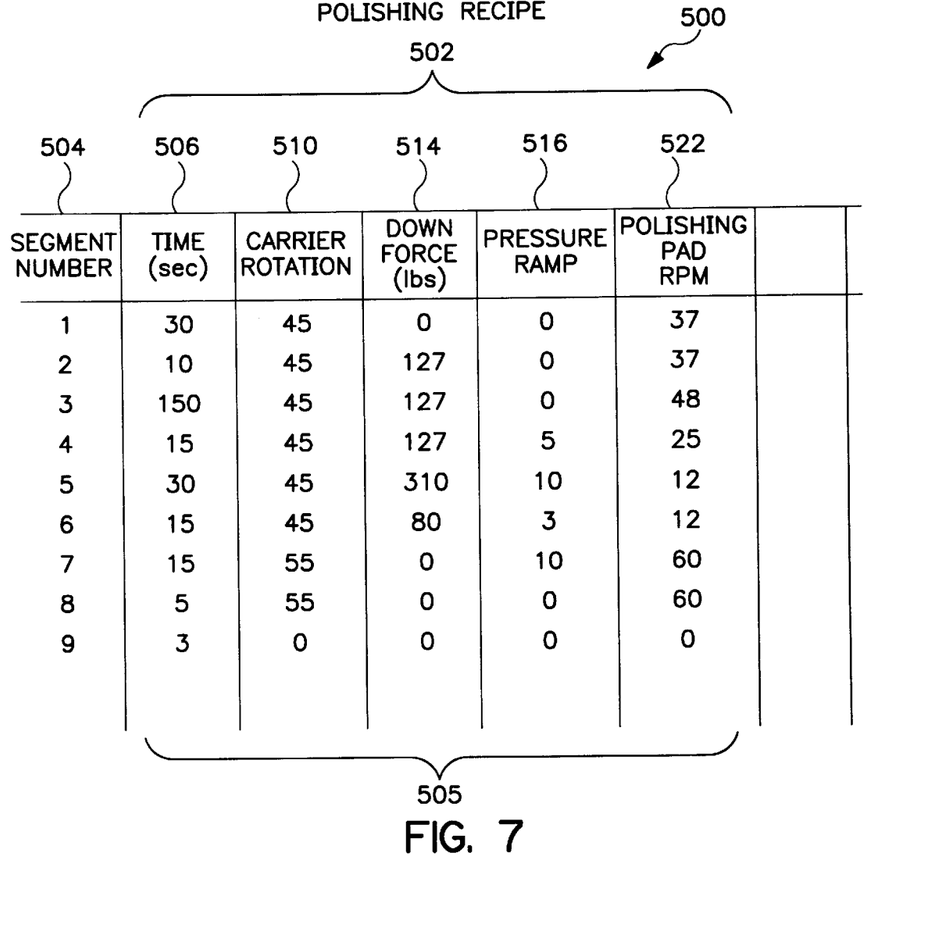
FIG. 7 is a table of exemplary operational parameters associated with a CMP polishing recipe.

Recipe 500 (or a plurality of recipes) may be entered into memory by a user of system 200. Alternatively, a number of recipes 500 may be stored for quick recall by a user. With reference to FIG. 7, an exemplary wafer polishing recipe 500 suitably includes a plurality of operational parameters 502 that are suitably selected to affect the global uniformity of a wafer 300 as well as the planarity within a die structure 308. In accordance with a preferred embodiment of the present invention, wafer polishing recipe 500 may be defined by a plurality of segments 504, with each segment 504 associated with a particular set of operational parameters 502. Preferably, with momentary reference to FIG. 6, segments 504 operate as steps in a predetermined sequence to provide an input control signal 450, comprising operational parameters 502, to controller 400.

Operational parameters 502 may include a down force parameter 514 and a polishing speed parameter 522. In accordance with the preferred embodiment, down force parameter 514 is associated with the down force applied by carrier apparatus 122 while polishing speed parameter 522 is associated with the rotational speed of polishing surface 126. In accordance with a particularly preferred embodiment of the present invention, wafer polishing recipe 500 comprises various other operational parameters 502, including segment or sequence time 506, carrier rotation 510 and carrier down pressure ramp time 516. Depending upon the particular application, recipe 500 may include additional, alternative, or fewer parameters than those shown in FIG. 7.

During operation, controller 400 retrieves data from recipe 500, including sequencing steps 504 and associated operational parameters 502, and sequentially operates wafer polishing apparatus 100 in accordance with steps 504 and parameters 502. In accordance with a preferred embodiment of the present invention, wafer polishing apparatus 100 is initiated with a relatively low down force 514 applied by carrier apparatus 122 and a relatively high polishing speed 522 for polishing surface 126. The present inventors have found that the combination of a low down force with a high polishing speed is extremely effective in removing the typically uneven surface layer 312 of substrate 314 within a single die structure 308. After a period of time, wafer polishing apparatus 100 is adjusted in a second step to utilize a relatively high down force 514 applied by carrier apparatus 122 and a relatively low polishing speed 522 for polishing surface 126. This second step (which incorporates a high down force with a low polishing speed) effectively reduces the non-uniformity of surface 302 without detrimentally affecting the planarity of die structures 308. Further, this two-step process provides a method for continuous polishing of surface 302 without requiring any operational downtime within the presently utilized wafer polishing apparatus 100 or reconfiguration within a different wafer polishing apparatus 100.

In accordance with one exemplary application, preferably as applied to a 6" semiconductor wafer, the high down force applied by carrier apparatus 122 is between a range of 200 to 350 lbs, preferably between 290 and 330 lbs, while the low down force is between a range of 75 to 250 lbs, preferably between 110 and 140 lbs. Further, in accordance with the present invention, preferably as applied to a 6" wafer, the high polishing speed for polishing surface 126 is between a range of 20 to 60 rpm, preferably between 45 and 50 rpm, while the low polishing speed is between 5 and 30 rpm, preferably between 10 and 15 rpm. In accordance with another exemplary application, for example, as applied to a 8" semiconductor wafer, the high down force applied by carrier apparatus 122 may be between 250 and 450 lbs while the low down force may be between 150 and 300 lbs. Further, the ranges for down force and polishing speed, such as specified above for the 6" and 8" wafers, may also vary according to a particular wafer's composition. As one skilled in the art will appreciate, in accordance with the present invention, various ranges exist for down force and polishing speed for any given application of wafer size and composition and these ranges are not limited in any manner.

Figure 8A:
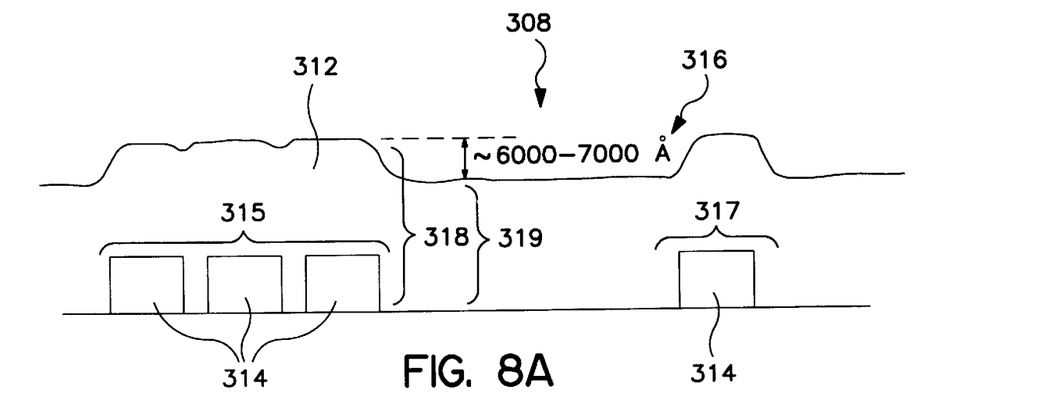
FIG. 8a is a side view of an individual die structure of a semiconductor wafer before planarization.
Figure 8B:
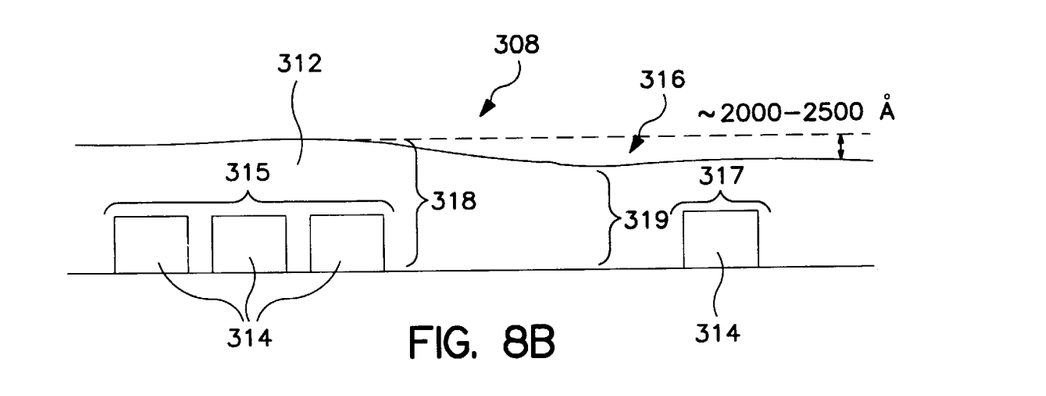
FIG. 8b is a side view of the die structure of FIG. 8a after planarization in accordance with the prior art methods.
Figure 8C:
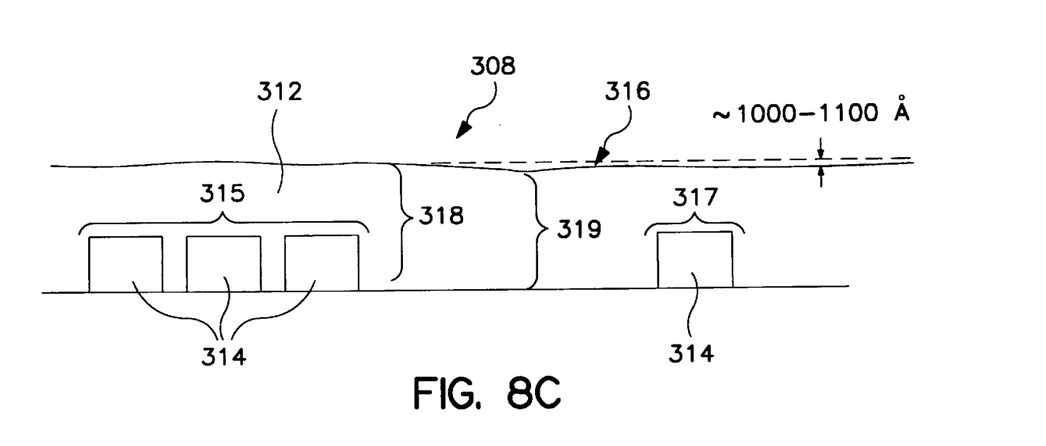
FIG. 8c is a side view of the die structure of FIG. 8a after planarization in accordance with the present invention.

As a result of the above two-step process, the planarity within any die structure 308 is improved while obtaining the desired global uniformity of entire surface 302 of semiconductor wafer 300. With reference to FIG. 8A, an illustration of a single die structure 308 is shown with a plurality of microelectronic structures 314 and an overlaying oxide layer 312. As one skilled in the art will appreciate, layer 312 and structures 314 typically produce an uneven region 316 defined by the difference in the thickness of oxide layer 312 in various regions 318 and 319 of die structure 308 and generally measuring between 6000 and 7000 Å. In accordance with the prior art methods, which generally focus on achieving only global uniformity, and with reference to FIG. 8B, uneven region 316 may be typically reduced by these prior art methods and apparatus to an area measuring between 2000 and 2500 Å. This result is generally created by the tendency of dense microelectronic structure areas 315 to polish slower than sparsely structured areas 317. Further, the use of a high down force alone without any further adjustment produces a tendency for polishing surface 126 to compress and follow contour 310 of die structure 308 and thus polish wafer 300 consistently over entire surface 302 without removing undesirable local features within die structure 308. However, in accordance with the present invention, uneven region 316 can be suitably reduced to a significantly smaller region, such as 1000 to 1100 Å, a reduction of approximately 50%, through the use of the above mentioned two process steps. As one skilled in the art will appreciate, this two-step process results in not only a reduction in uneven region 316 and thus improved die planarity throughout the wafer surface but also in improved product yield by minimizing the effective polishing rate within sparsely structured areas 317.

The particular embodiment of the present invention mentioned above begins with an initial low down force and high polishing speed and then follows with a subsequent high down force and low polishing speed. However, the present invention may also be suitably configured to reverse these two process steps, i.e. an initial high down force-low polishing speed with a subsequent low down force-high polishing speed, to achieve comparable results in planarity within die structure 308 and global uniformity of surface 302.

As mentioned above, the present invention may also be suitably configured to provide various other operational parameters 502 that can be varied to facilitate further improvement in the optimization of planarity and global uniformity, such as, for example, sequence time 506, carrier rotational speed 510 and down force ramp time 516.

In a particularly preferred embodiment of the present invention, described herein for illustrative purposes and shown in FIG. 7, a wafer polishing recipe 500 suitably includes a plurality of segment numbers 504, each associated with a particular set of values 505 associated with operational parameters 506, 510, 514, 516 and 522. In accordance with this preferred embodiment, segment numbers 504 represent various process steps. In a step 1, a pre-wetting of polishing surface 126 can occur while carrier apparatus 122 is initially rotated at a speed of 45 rpm and polishing surface 126 is initially rotated at a speed of 37 rpm. In accordance with this illustration, this process can continue for a predetermined period, for example 30 seconds, as indicated in sequence time 506.

In a step 2, carrier apparatus 122 can suitably lower wafers 300 into operative engagement with polishing surface 126 to begin planarization of wafer surface 302. As illustrated, an initial low down force, for example 127 lbs, can be applied by carrier apparatus 122 and thus wafer surface 302, onto polishing surface 126 for another predetermined amount of time, for example 10 seconds. This process step is typically utilized without oscillation of individual elements 124 of carrier apparatus 122.

In a step 3, polishing speed 522 of polishing surface 126 can be suitably increased to a high speed, for example 48 rpm, to begin the optimization of the planarity within each die structure 308. Step 3 may be performed for an appropriate period of time, for example, 150 seconds. As previously discussed, this process may include an oscillation of wafers 300 back and forth across surface 126 as both carrier apparatus 122 and surface 126 are rotating and pressing against surface 302.

In a step 4, polishing speed 522 can be suitably decreased to a lower value, such as 25 rpm, to suitably facilitate the gradual reduction in polishing speed 522 of polishing surface 126 to an even lower rotational speed. This "transition" step is performed for an appropriate time period, for example, 15 seconds.

Next, in a step 5, polishing speed 522 of polishing surface 126 can be reduced even further to a lower rotational speed, such as 12 rpm, while down force 514 of carrier apparatus 122 is suitably increased to a high down force, such as 310 lbs. As shown, step 5 may be performed for any desired time period, for example 30 seconds. As previously discussed, this step 5 includes a high down force with a low polishing speed facilitates a reduction in the global non-uniformity of wafer surface 302 while maintaining the desired planarity for each individual die structure 308. Alternatively, as earlier discussed, steps 3 and 5 may be suitably reversed in accordance with the present invention to produce comparable results in the planarity of die structure 308 and the global uniformity of entire surface 302 of wafer 300.

Next, as shown in this illustrated example of a particularly preferred embodiment, a step 6 may be utilized by controller 400 to reduce the down force of carrier apparatus 122 to a relatively low value, such as 80 lbs, as wafer polishing apparatus 100 completes the planarization process of wafer 300. This step 6 and the remaining steps 7–9 can be suitably configured in various manners to ramp down and complete the planarization process of wafer 300 and are not limited in any manner. Further, steps 504 can be suitably configured to include various ramp times, such as, for example, a slow ramp time or a stepped or sudden ramp time, or the like.

Although wafer polishing recipe 500 is shown with five operational parameters, it will be appreciated that the present invention may include various other parameters, such as, for example, the ramp time for rotational speeds of carrier apparatus 122 and polishing surface 126, the oscillation distance of elements 124 of carrier apparatus 122 about polishing surface 126, and any other like parameters now known or hereafter devised by those skilled in the art.

In summary, the present invention provides improved methods and apparatus for optimizing the removal of thin film layers during planarization of a semiconductor wafer to achieve improved die planarity and global uniformity. In a preferred embodiment, a wafer polishing apparatus is initiated in a first step with a low down force applied by a carrier apparatus and a high polishing speed applied by a polishing surface to facilitate removal to an oxide layer from the surface of a wafer to achieve a desired planarity within an individual die structure. After this step, the wafer polishing apparatus is initiated with a high down force applied by the carrier apparatus and a low polishing speed applied by the polishing surface to obtain a desired global uniformity of the entire surface of the semiconductor wafer.

Although the subject invention is described herein in conjunction with the appended drawing figures, it will be appreciated that the invention is not limited to the specific form shown. Various modifications in the selection and arrangement of parts, components, and processing steps may be made in the implementation of the invention. For example, although a preferred embodiment is set forth in which an exemplary polishing surface is utilized, it will be appreciated that virtually any polishing surface may be employed, such as, for example, belt polishers, roller polishers, linear polishers, and/or the like, without departing from the present invention. Moreover, although illustrated ranges of values for the various operational parameters were discussed in the context of a preferred embodiment of the present invention, the ranges are not limiting and can be suitably configured for various other preferred ranges depending on various others factors, such as wafer size, composition and hardness, polishing surface texture and hardness, slurry compositions and/or the like. These and other modifications may be made in the design and arrangement of the various components which implement the invention without departing from the spirit and scope of the invention as set forth in the appended claims.

What is claimed is:

1. A method for polishing a surface of a semiconductor wafer comprising the steps of:

selecting a first rotational speed for a polishing surface and a first down force to be applied between the wafer and said polishing surface;

applying said first rotational speed and said first down force to polish the surface of the semiconductor wafer;

selecting a second rotational speed for said polishing surface and a second down force to be applied between the wafer and said polishing surface, wherein said second rotational speed is slower than said first rotational speed and said second down force is greater than said first down force; and applying said second rotational speed and said second down force to further polish the surface of the semiconductor wafer.

2. A method as recited in claim 1, wherein said first rotational speed and said first down force are selected to achieve planarity within a die structure of the surface of the wafer.

3. A method as recited in claim 1, wherein said second rotational speed and said second down force are selected to achieve global uniformity for the surface of the wafer.

4. A method for polishing a surface of a semiconductor wafer comprising the steps of:

polishing the surface to achieve global uniformity of the surface of the wafer, wherein said step of polishing the surface to achieve global uniformity includes selecting an appropriate first down force applied to and a first rotational speed for a polishing surface; and polishing the surface to achieve planarity within a die structure of the wafer, wherein said step of polishing the surface to achieve planarity includes selecting an appropriate second down force that is greater than said first down force and selecting an appropriate second rotational speed that is slower than said first rotational speed.

5. A system for polishing the surface of a semiconductor wafer, which comprises:

a wafer polishing apparatus comprising a polishing surface;

a controller for operating said polishing apparatus; and a polishing recipe, wherein said recipe provides said controller with an instruction set to facilitate the polishing of the surface of the semiconductor wafer to achieve planarity within a die structure of the semiconductor wafer and to achieve global uniformity of the surface of the semiconductor wafer, and wherein said instruction set comprises:

instructions for providing a first down force to be applied to and a first polishing speed for said polishing surface such that the combination of said first down force and first polishing speed provides planarity within said die structure; and instructions for providing a second down force to be applied to and a second polishing speed for said polishing surface, said second down force being greater than said first down force and said second polishing speed being slower than said first polishing speed, such that the combination of said second down force and second polishing speed provides global uniformity of the surface of the semiconductor wafer.

6. A system as recited in claim 5, wherein said first polishing speed is greater than said second polishing speed and said second down force is greater than said first down force.

7. A multi-step CMP process for a semiconductor wafer which comprises:

selecting a first polishing speed for and a first down force to be applied to a polishing surface;

applying said first polishing speed and said first down force to polish the surface of the semiconductor wafer to achieve planarity within a die structure of the semiconductor wafer;

selecting a second polishing speed for and a second down force to be applied to said polishing surface, wherein said second polishing speed is slower than said first polishing speed and said second down force is greater than said first down force; and applying said second rotational speed and said second down force to further polish the surface of the semiconductor wafer to achieve global uniformity.

8. A process as recited in claim 7, wherein the step of selecting said first polishing speed and said first down force comprises selecting said first down force within a range of 100 and 300 lbs and said first polishing speed within a range of 20 to 60 rpm.

9. A process as recited in claim 8, wherein said first down force is between a range of 110 and 140 lbs and said first polishing speed is between a range of 45 and 50 rpm.

10. A process as recited in claim 7, wherein the step of selecting said second polishing speed and said second down force comprises selecting said second down force within a range of 200 to 450 lbs and said second polishing speed within a range of 5 to 30 rpm.

11. A process as recited in claim 10, wherein said second down force is between a range of 300 and 350 lbs and said second polishing speed is between a range of 10 and 15 rpm.

* * * * *